(12) United States Patent
Desel

(10) Patent No.: US 9,871,505 B2
(45) Date of Patent: Jan. 16, 2018

(54) VOLTAGE-RESISTANT SWITCH

(71) Applicant: Micronas GmbH, Freiburg (DE)

(72) Inventor: Thomas Desel, Freiburg (DE)

(73) Assignee: TDK-Micronas GmbH, Freiburg (DE)

( * ) Notice: Subject to any disclaimer, the term of this patent is extended or adjusted under 35 U.S.C. 154(b) by 0 days.

(21) Appl. No.: 15/382,934

(22) Filed: Dec. 19, 2016

(65) Prior Publication Data

US 2017/0179941 A1 Jun. 22, 2017

(30) Foreign Application Priority Data

Dec. 17, 2015 (DE) ........................ 10 2015 122 109

(51) Int. Cl.
*H03K 17/081* (2006.01)
*H03K 17/687* (2006.01)
*H01L 27/088* (2006.01)

(52) U.S. Cl.
CPC ..... *H03K 17/08104* (2013.01); *H01L 27/088* (2013.01); *H03K 17/6874* (2013.01)

(58) Field of Classification Search
CPC ....... H03K 17/08104; H03K 17/687–17/6874; H01L 27/088
See application file for complete search history.

(56) References Cited

U.S. PATENT DOCUMENTS

| 4,595,847 | A | 6/1986 | Weir |
| 6,424,035 | B1 | 7/2002 | Sapp et al. |
| 7,599,159 | B2 * | 10/2009 | Feese ................. H03K 17/6874 361/111 |
| 7,835,126 | B2 | 11/2010 | Taylor |
| 8,675,323 | B2 | 3/2014 | Sudo |
| 8,698,546 | B1 * | 4/2014 | Mishra ............... H03K 17/6871 326/113 |
| 9,520,869 | B2 * | 12/2016 | Fiedorow ............. H03K 17/162 |
| 2015/0098160 | A1 | 4/2015 | Gao et al. |
| 2015/0333627 | A1 * | 11/2015 | Song ........................ A61B 8/14 600/443 |
| 2016/0204780 | A1 * | 7/2016 | Tokai ................. H03K 17/6871 327/408 |

FOREIGN PATENT DOCUMENTS

DE 1 03 58 048 A1 3/2005

* cited by examiner

*Primary Examiner* — Patrick O'Neill
(74) *Attorney, Agent, or Firm* — 24IP Law Group; Timothy R DeWitt

(57) ABSTRACT

A voltage-resistant switch is described. The switch comprises a signal input, a first FET transistor with a first channel with an extended drain and a first gate connector and a second FET transistor with a first channel with an extended drain and a second gate connector. A control signal connector is connected with the first gate connector and with the second gate connector via a second node and with the first channel and the second channel via a second resistor, and a signal connector is connected with the second channel. The voltage-resistant switch can be switched on and off.

11 Claims, 5 Drawing Sheets

VOLTAGE-RESISTANT SWITCH

CROSS-REFERENCE TO RELATED REFERENCED APPLICATIONS

This application claims benefit of and priority to German Patent Application DE10 2015 122 109, filed on 17 Dec. 2015. The entire disclosure of German Patent Application DE10 2015 122 109 is hereby incorporated by reference.

BACKGROUND OF THE INVENTION

Field of the Invention

The invention relates to a voltage-resistant switch and a circuit with said voltage-resistant switch.

Brief Description of the Related Art

Due to the progressing miniaturization of the structures of the components and the associated smaller oxide thicknesses of the gate connectors, there arises the problem in MOS components that the supply voltage $V_{dd}$ for modern circuits has to be further reduced constantly. In such circuits excessively high supply voltages can lead to damage to or even destruction of the MOS components due to the change of the electric properties.

The voltage-resistance with respect to the drain-source contacts along the channel in so-called high-voltage MOS transistors is achieved substantially through weakly doped drift areas. In order not to impair the electric properties of the MOS transistors, the oxide thickness cannot be increased by any desired degree in order to improve the voltage-resistance. To be able to switch through a voltage signal with a MOS transistor with as little influence as possible, while taking account of the threshold voltage of the MOS transistor, for example in the case of an NMOS transistor, the value of the gate potential must be higher than the drain or the source potential.

In some circuits, however, it is frequently required to switch voltages which are higher than the technologically maximally admissible gate-source voltage. The maximally admissible gate-source voltage can be exceeded therein, which can lead to a damage to or even destruction of the MOS transistor. Such an example is a programmable EEPROM circuit with a signal input in which the maximum value of the input signal at the signal input amounts to 5V during regular operation, but in the programming/erasing mode can amount to a value of +12V/−12V. The individual components of the circuit are dimensioned such that these components can withstand a maximum value of 5V and thus have to be protected against an input signal with a voltage of >5.5V.

From the German published patent application no. DE 1 03 58 048 A1 (Biotronik) a voltage-resistant switch is known, having a switch control unit with a control input and a safety output connected with a switch input of a safety switch. This safety switch is arranged and configured such that the safety switch electrically connects the gate connector of a first MOS switching transistor with the source connector of the first MOS switching transistor in dependence of a safety signal, when the switch control unit emits the safety signal to the safety input of the safety switch, wherein the switch control unit is configured to generate and emit this safety signal.

The U.S. Pat. No. 7,835,126 (Kyocera) shows a short-circuit protection circuit for an internal current source that can be connected with an external unit. The output is equipped with two MOS transistors which are conductive during regular operation. When a short circuit occurs, the voltage at one of the gates of a MOS transistor is increased and the MOS transistor is switched off, i.e. the MOS transistor is no longer conductive. The internal current source is isolated thereby and a damage is thus largely prevented.

SUMMARY OF THE INVENTION

In view of the state of the known technology and in accordance with one aspect of the present invention, a voltage-resistant switch is provided that comprises a signal input, a first FET transistor with a first channel with an extended drain and a first gate connector, a second FET transistor with a second channel with an extended drain and a second gate connector, a control signal connector connected with the first gate connector and the second gate connector via a second node, and with the first channel and the second channel via a second resistor, and a signal connector connected with the second channel.

BRIEF DESCRIPTION OF THE DRAWINGS

The invention will now be described on the basis of figures. It will be understood that the embodiments and aspects of the invention described in the figures are only examples and do not limit the protective scope of the claims in any way. The invention is defined by the claims and their equivalents. It will be understood that features of one aspect or embodiment of the invention can be combined with a feature of a different aspect or aspects of other embodiments of the invention. This invention becomes more obvious when reading the following detailed descriptions of some examples as part of the disclosure under consideration of the enclosed drawings. Referring now to the attached drawings which form a part of this disclosure. The invention will hereinafter be described in more detail with reference to figures. There are shown:

DETAILED DESCRIPTION

The object of the present invention is fully described below using examples for the purpose of disclosure, without limiting the disclosure to the examples. The examples present different aspects of the present invention. To implement the present technical teaching, it is not required to implement all of these aspects combined. Rather, a person skilled in the art will select and combine those aspects that appear sensible and required for the corresponding application and implementation.

Figure 1:
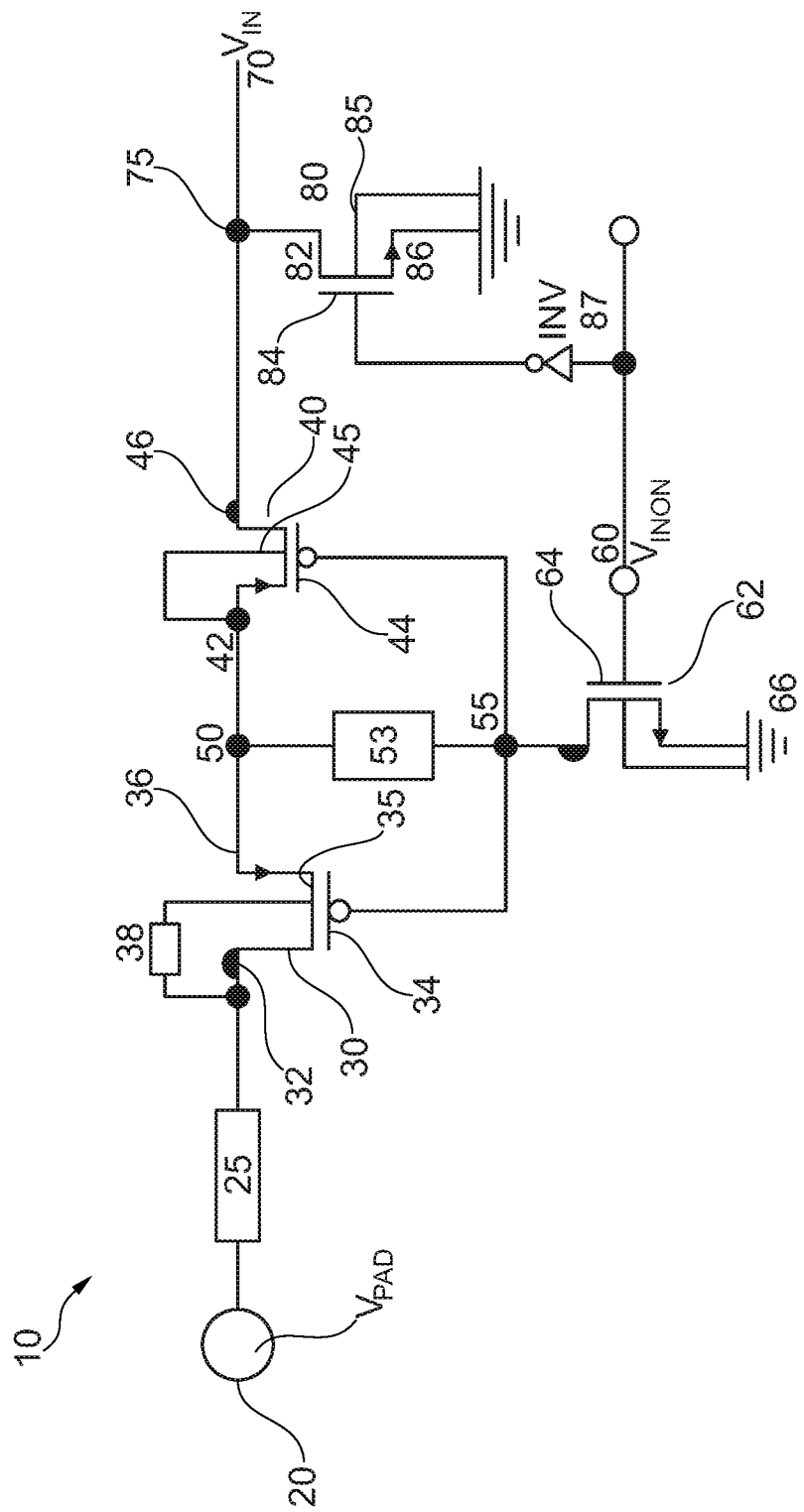
FIG. 1 is a schematic of a circuit arrangement of a voltage-resistant switch.

FIG. 1 shows schematically the circuit arrangement of a voltage-resistant switch 10 with a signal input 20, at which there is applied an input signal $V_{PAD}$. The signal input 20 is a so-called pad on a semiconductor chip and can be connected with a plurality of circuits on the semiconductor chip. The voltage-resistant switch 10 can be switched on and off via a signal $V_{inon}$ at a control signal connector 60.

For example, an EEPROM circuit has circuitry which is used for programming the EEPROM circuit and needs the input signal $V_{PAD}$ with a higher voltage of 12V, for example, for the programming. The programmed circuits receive an input signal with a maximum value of 5V during regular operation. Said programmed circuits are damaged upon applying the input signal $V_{PAD}$ with a higher value, for example >5.5V. It is consequently necessary either to make available two different types of connectors on the semiconductor chip or to build a voltage-resistant protection circuit preventing the further transmission of a signal with a value of 12V to the programmed circuits.

The structure of the voltage-resistant switch 10 according to the invention will be described now. The values and dimensions of the individual components specified in this description are merely exemplarily and do not limit the invention.

The switching function of the voltage-resistant switch 10 is implemented using a first FET transistor 30 and a second FET transistor 40 and switched via the control signal connector 60. The signal input 20 is connected with the first drain connector 32 of the first FET transistor 30 via an input resistor 25, wherein the input resistor 25 mainly serves as an electrostatic discharge protection. The input resistor 25 has a value of 5 kΩ, for example. The first FET transistor 30 is a PMOS transistor and has an extended drain connector 32 (so-called "extended drain") and can consequently withstand an applied voltage of +12V.

Figure 5:
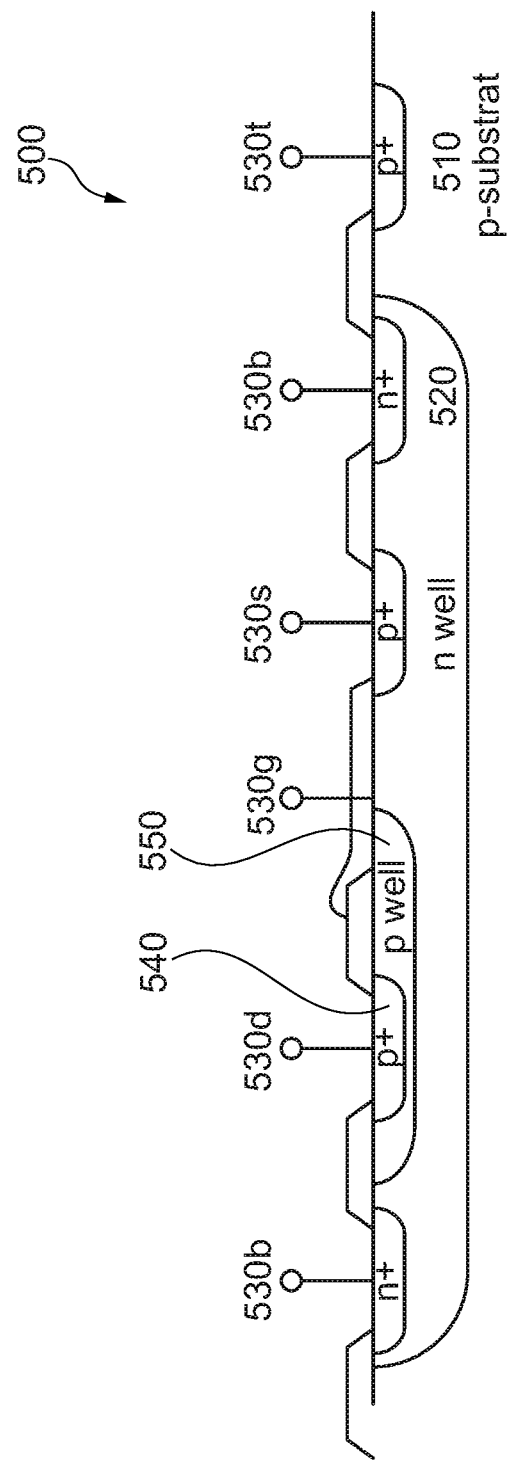
FIG. 5 is a cross-section of an asymmetric HV-PMOS transistor.

In one aspect, the first FET transistor 30 and the second FET transistor 40 are each configured as an HV PMOSFET transistor (high-voltage P-channel MOSFET) 500, which is represented in FIG. 5. HV MOSFET transistors 500 have a p-doped substrate 510 with an n-doped well 520 and typically have five connectors 530; a drain connector 530d, a gate connector 530g, a source connector 530s, at least one bulk connector 530b and a substrate connector 530t. A PMOS transistor with the drain connector 530d, the gate connector 530g and the source connector 530s is formed in the n-doped well 520. The drain connector 530d is formed of a higher p-doped area 540 in a p-doped well 550. The drain connector 530d is more voltage-resistant through the lower doping in the p-doped well 550.

The first drain connector 32 (corresponds to 530d in FIG. 5) of the first FET transistor 30 in FIG. 1 is connected with a first bulk connector 35 (corresponds to 530b in FIG. 5) of the first FET transistor 30 via a high resistance resistive first resistor 38. Said first resistor 38 has a value of 20 kΩ, for example, and, together with the input resistor 35, protects the first FET transistor 30 upon applying a voltage of −12V.

The first source connector 36 is connected with a first node 50, which is in turn connected with a second source connector 42 of the second FET transistor 40. As mentioned above, the first FET transistor 30 and the second FET transistor 40 together form a switch which is switched on and off by a control signal $V_{inon}$ non at a control signal connector 60. The second FET transistor 40 is also a PMOS transistor and also that a second gate connector 44 and a second drain connector 46. The second drain connector 46 is connected with a signal connector 70 for the input signal $V_{in}$ for the programmed circuit. The second bulk connector 45 and the second source connector 42 are likewise interconnected, wherein this connection does not have a considerable resistance. The second drain connector 46 also has an additional well (so-called "extended drain" 520 in FIG. 5) and can consequently withstand higher voltages.

The first gate connector 34 is connected with the second gate connector 44 via a second node 55. Between the first node 50 and the second node 55 there is arranged a second resistor 53. The second resistor 53 has a value of 50 kΩ, for example. A third FET transistor 63 with a third gate connector 64 is connected between the second node 55 and the neutral conductor (ground) 66. The third FET transistor 62 is configured as an HV NMOSFET transistor (high-voltage N-channel MOSFET) in one aspect. The third gate connector 64 is connected with the control signal connector 60, at which the control signal $V_{inon}$ is applied for switching the voltage-resistant switch 10 on and off. Consequently, the third FET transistor 62 is switched on and off by the control signal $V_{inon}$, wherein the drain in the switched-off state must withstand the voltage of the signal input 20 (12V).

A third node 75 is arranged between the signal connector 70 and the second drain connector 46. A fourth FET transistor 80 is arranged between the third node 75 and the neutral conductor in this aspect of the voltage-resistant switch 10. The fourth FET transistor 80 has a fourth gate connector 84 connected with a gate signal. A bulk connector 85 of the fourth FET transistor 80 is connected with the neutral conductor. The channel of the fourth FET transistor 80 is connected between the third node 75 and the neutral conductor.

Figure 2:
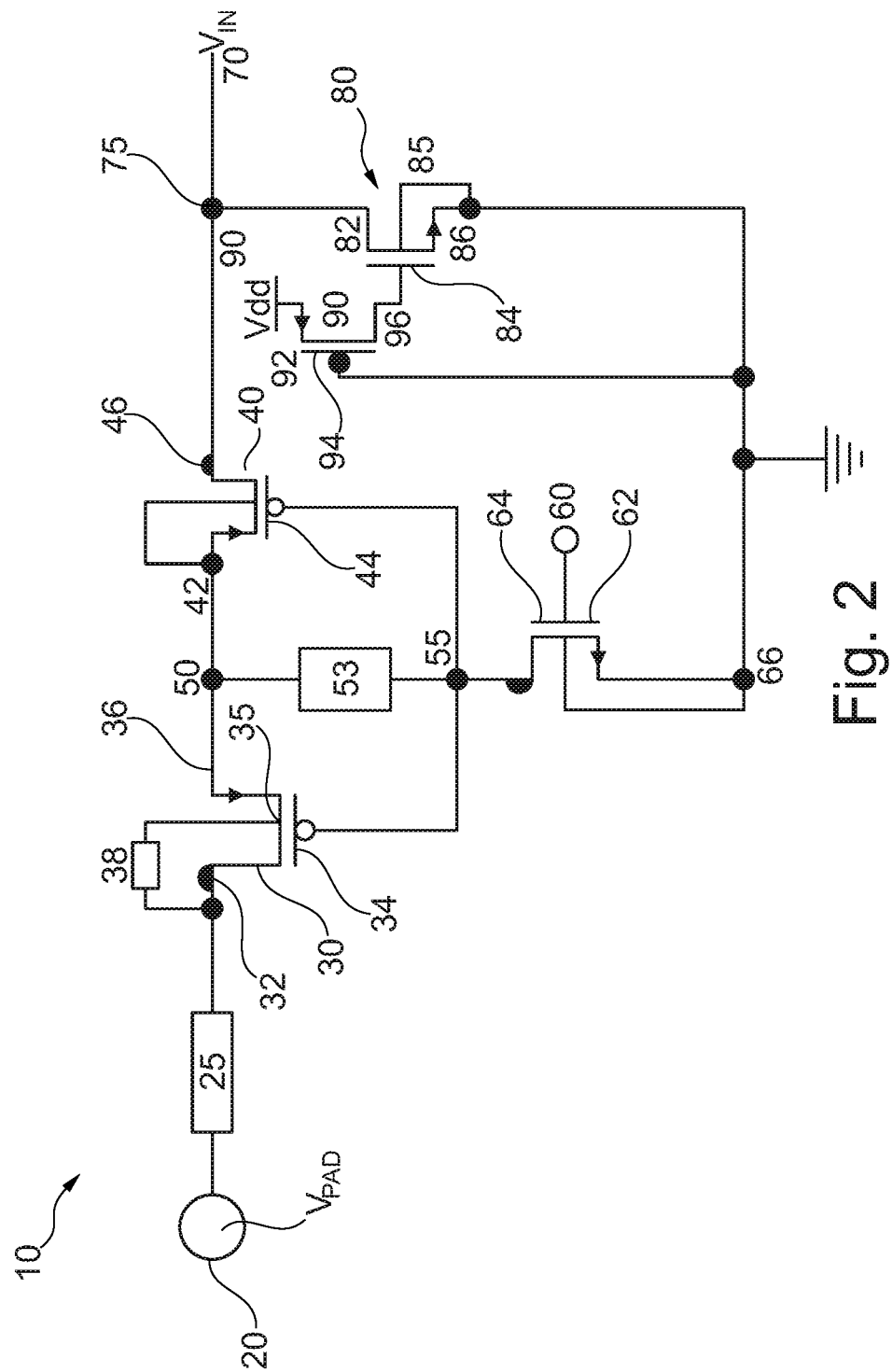
FIG. 2 is a schematic of a second aspect of the circuit arrangement of the voltage-resistant switch.

The gate signal at the gate connector 84 can be a pulse signal or the supply voltage $V_{dd}$ (FIG. 2). Said gate connector 84 can also be controlled with the control signal connector 60 via an inverter 87 (FIG. 1) or can be connected to the supply voltage $V_{dd}$ via a fifth PMOS transistor 90 (FIG. 2).

The mode of function of the voltage-resistant switch 10 will now be described. In the switched-off state the control signal $V_{inon}$ at the control signal connector 60 is off (i.e. $V_{inon}=0$) and the third FET transistor 62 is consequently also "off", i.e. highly resistive. The second resistor 53 effects that also the first FET transistor 30 and the second FET transistor 40 are switched off, since the respective gate-source voltages of the first FET transistor 30 and of the second FET transistor 40 are at 0V. The voltage at the first gate connector 34 of the first FET transistor 30 consequently follows the input signal $V_{PAD}$ at the signal input 20, that is up to a voltage that corresponds to the breakdown voltage of the two FET transistors 30 and 40. Due to the extended drain at the first drain connector 32 the breakdown voltage is higher than 12V and is at 18V, for example.

In the case of reverse polarity at a voltage between 0 and −12V in the switched-off state the n-well 520 of the first drain connector 32 (corresponds to 530D in FIG. 5) is conductive. In this case, the current flows through a diode formed by the n-well 520 and the p-substrate 510. The voltage at the first bulk connector 35 (530b) is clamped at around 0.75V and the current is limited to around 0.5 mA at a voltage of −12V due to a corresponding dimensioning through the input resistor 25 and the first resistor 38. This low current does not damage the first FET transistor 30 (and the second FET transistor 40 neither).

It has to be taken into account that the protection is effective also in the case of a voltage of −12V in a switched-on state. A voltage of +12V does not occur in the switched-on state.

In a further aspect of the voltage-resistant switch 10 represented in FIG. 2, a fourth gate connector 84 of the fourth NMOS-FET transistor 80 is connected with a drain connector of a fifth PMOS-FET transistor 90. A fifth gate connector 94 of the fifth FET transistor 90 is connected with ground 66 and the fifth FET transistor 90 is consequently conductive. The fourth gate connector 84 is connected with the supply voltage $V_{dd}$ via the fifth FET transistor 90 and the fourth FET transistor 80 is therefore switched on and works like a resistor with a value of around 200 kΩ (like the resistor 88 in FIG. 3).

Figure 3:
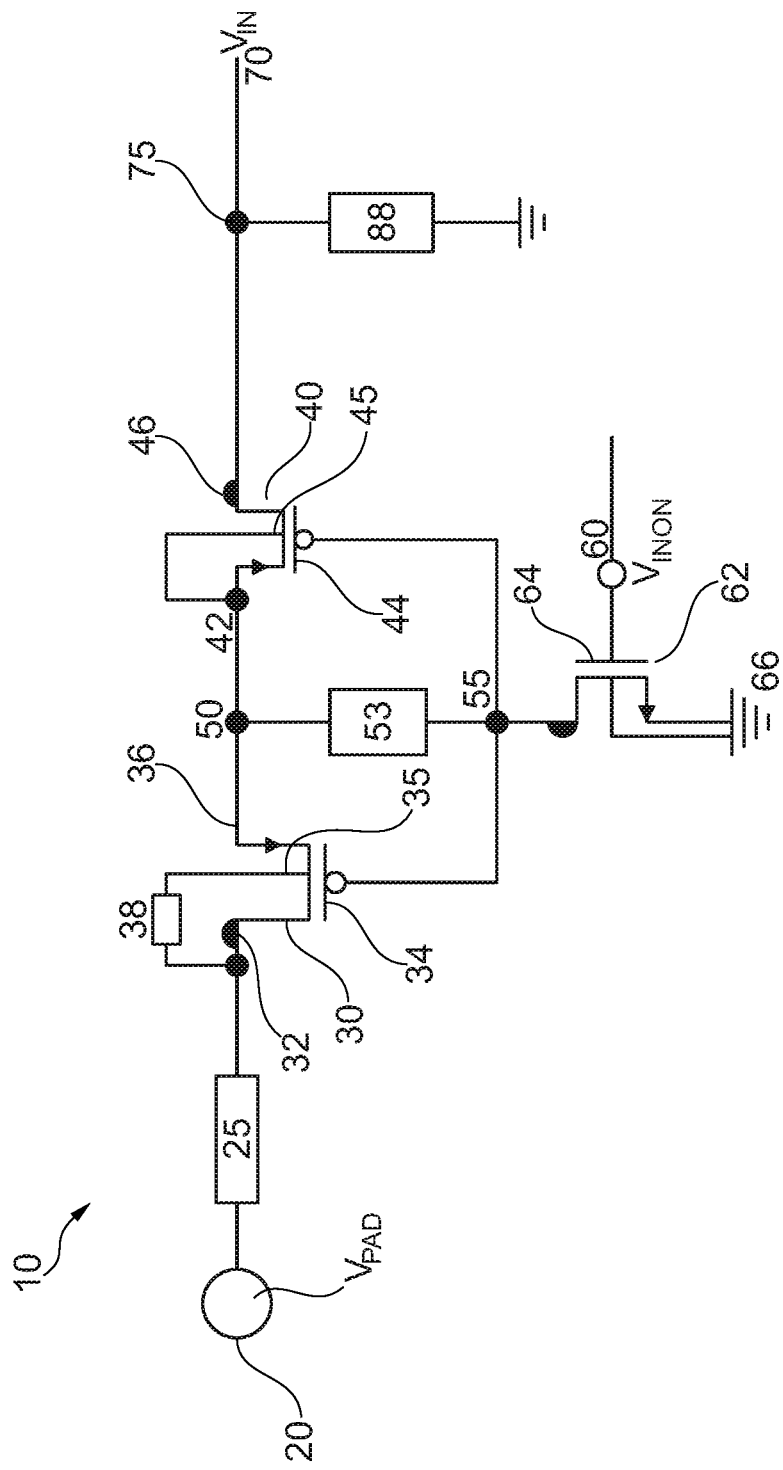
FIG. 3 is schematic of a third aspect of the circuit arrangement of the voltage-resistant switch.
Figure 4:
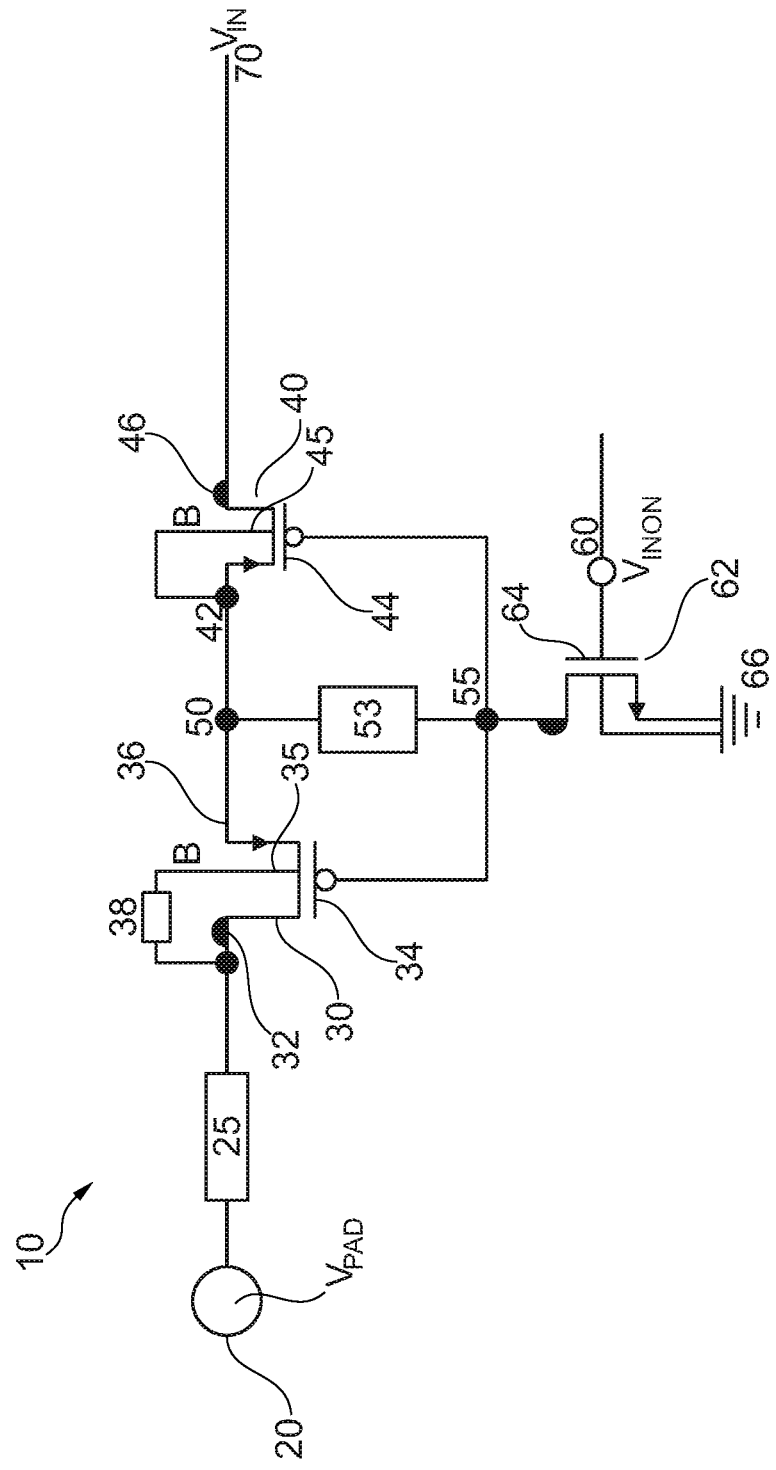
FIG. 4 is a schematic of a fourth aspect of the circuit arrangement of the voltage-resistant switch.

A third aspect of the voltage-resistant switch 10 is represented in FIG. 3. Instead of the fourth FET transistor 80 a high resistance resistive resistor 88 is inserted. In a fourth aspect (FIG. 4) of the voltage-resistant switch 10 the fourth FET transistor 80 has been removed without replacement.

In the switched-on state the control signal $V_{inon}$ is high and the voltage-resistant switch 10 can transmit the input signal $V_{PAD}$ with an input voltage at the signal input 20 of 1V to 5V. The lower voltage value of 1V is limited predominantly by the threshold voltage of the first FET transistor 30 and of the second FET transistor 40. The second resistor 38 is chosen to be highly resistive (e.g. 20 kΩ) and consequently the voltage drops at the third FET transistor 62 is small. The voltage drops at the input resistor 25 and at the first FET transistor 30 is also small. This arrangement effects a voltage-divider function of the voltage-resistant switch 10, in turn leading to a dampening of the input voltage at the signal input 20 which is passed on to the signal connector 70.

In the exemplary dimensioning of this embodiment the input voltage at the signal input 20 is "dampened" in accordance with one of the following equations.

Without fourth FET transistor 80 $R_{m_{80}}$:

$$V_{in_1} = \frac{(R_{53} + R_{m_{62}\_R_{ON}})}{(R_{25} + R_{m_{30}\_R_{ON}} + R_{53} + R_{m_{62}\_R_{ON}})} \times V_{pad}$$

With fourth FET transistor 80 $R_{m_{80}}$:

$$V_{in_2} = \frac{(R_{53} + R_{m_{62}\_R_{ON}})}{(R_{25} + R_{m_{30}\_R_{ON}} + R_{53} + R_{m_{62}\_R_{ON}})} \times \frac{R_{m_{80}\_R_{ON}}}{(R_{m_{40}\_R_{ON}} + R_{m_{80}\_R_{ON}})} \times V_{pad}$$

with the exemplary values:
$R_{25}$=5 kOhm (value of the input resistor 25)
$R_{53}$=50 kOhm (value of the second resistor 53)

$R_{m_{30}\_R_{ON}}$ = 2 kOhm (value of the channel resistance of the first FET transistor 30 in the conductive state)

$R_{m_{62}\_R_{ON}}$ = 1 kOhm (value of the channel resistance of the third FET transistor 30 in the conductive state)

$R_{m_{40}\_R_{ON}}$ = 2 kOhm (value of the channel resistance of the first FET transistor 30 in the conductive state)

$R_{m_{80}\_R_{ON}}$ = 200 kOhm (value of the channel resistance of the fourth FET transistor 30 in the conductive state)

the following "dampening" results:

$V_{in_1}$=0.88×$V_{pad}$ $V_{in_2}$=0.87×$V_{pad}$ $V_{pad}$ is the voltage at the signal input and $V_{in_1}$, $V_{in_2}$ are the voltages at the signal connector 70. This computation requires that no resistance resistive load is connected to the signal connector 70 $V_{in}$.

From the above description of the present invention, those skilled in the art will perceive improvements, changes, and modifications on the present invention. Such improvements, changes, and modifications within the skill in the art are intended to be covered by the appended claims.

REFERENCE NUMBERS

10 voltage-resistant switch
20 signal input
25 input resistor
30 first FET transistor
32 first drain connector
34 first gate connector
35 first bulk connector
36 first source connector
38 first resistor
40 second FET transistor
42 second source connector
44 second gate connector
45 second bulk connector
46 second drain connector
50 first node
53 second resistor
55 second node
60 control signal connector
62 third FET transistor
64 third gate connector
66 neutral conductor
70 signal connector
75 third node
80 fourth FET transistor
82 fourth drain connector
84 fourth gate connector
85 fourth bulk connector
86 fourth source connector
87 inverter
88 high resistance resistive resistor
90 fifth FET transistor
92 fifth source connector
94 fifth gate connector
96 fifth drain connector
500 PMOSFET transistor
510 p-doped substrate
520 n-doped well
530*b* bulk connector
530*d* drain connector
530*g* gate connector
530*s* source connector
530*t* substrate connector
540 p-doped area
550 p-doped well

What is claimed is:
1. A voltage-resistant switch comprising:
a signal input;
a first FET transistor with a first channel with an extended drain and a first gate connector;
a second FET transistor with a second channel with an extended drain and a second gate connector;
a control signal connector connected with the first gate connector and the second gate connector via a second node, and with the first channel and the second channel via a second resistor; and
a signal connector connected with the second channel.

2. The voltage-resistant switch according to claim 1, wherein the control signal connector comprises a third FET transistor that is arranged between the second node and a neutral conductor and has a third gate connector connected with a control signal ($V_{inon}$).

3. The voltage-resistant switch according to claim 2, wherein a third node between the second channel and the signal connector is connected with a fourth FET transistor, and wherein the fourth FET transistor comprises a fourth drain connector connected with the third node, a fourth source connector connected with the third FET transistor via the neutral conductor, a fourth gate connector connected with a fifth FET transistor via the fifth drain connector, and wherein the fifth FET transistor has a fifth gate connector connected with the third FET transistor via the neutral conductor and a fifth source connector connected with a supply voltage ($V_{dd}$).

4. The voltage-resistant switch according to claim 1, wherein the first FET transistor has a first drain connector, a first source connector and a first bulk connector, wherein the first drain connector is connected with the signal input and the first source connector is connected with the second channel of the second FET transistor and the first channel extends between the first drain connector and the first source connector.

5. The voltage-resistant switch according to claim 4, wherein the first bulk connector is connected with the first drain connector via a first resistor.

6. The voltage-resistant switch according to claim 4, wherein the first drain connector has an extended well.

7. The voltage-resistant switch according to claim 1, wherein the second FET transistor has a second drain connector, a second source connector and a second bulk connector, wherein the second drain connector is connected with the signal connector and the second source connector is connected with the first channel of the first FET transistor and the second channel extends between the second drain connector and the second source connector.

8. The voltage-resistant switch according to claim 7, wherein the second bulk connector is connected with the second drain connector.

9. The voltage-resistant switch according to claim 7, wherein the second drain connector has an extended well.

10. The voltage-resistant switch according to claim 1, wherein an input resistor is connected between the signal input and the first FET transistor.

11. The voltage-resistant switch according to claim 1, wherein a third node between the second channel and the signal connector is connected with a fourth FET transistor, and wherein the fourth FET transistor comprises a fourth drain connector connected with the third node, a fourth source connector connected with the neutral conductor, and a fourth gate connector to which a further signal can be applied.

* * * * *